United States Patent
Loibl et al.

(10) Patent No.: US 9,258,918 B2
(45) Date of Patent: Feb. 9, 2016

(54) MODULE FOR INTEGRATED CONTROL ELECTRONICS HAVING SIMPLIFIED DESIGN

(75) Inventors: Josef Loibl, Bad Abbach (DE); Thomas Preuschl, Eislbrunn (DE); Hermann-Josef Robin, Regensburg (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 1305 days.

(21) Appl. No.: 12/676,935

(22) PCT Filed: Aug. 4, 2008

(86) PCT No.: PCT/EP2008/060227
§ 371 (c)(1),
(2), (4) Date: Jun. 8, 2010

(87) PCT Pub. No.: WO2009/033890
PCT Pub. Date: Mar. 19, 2009

(65) Prior Publication Data
US 2010/0271791 A1    Oct. 28, 2010

(30) Foreign Application Priority Data
Sep. 7, 2007 (DE) .......................... 10 2007 042 593

(51) Int. Cl.
*H05K 7/00* (2006.01)
*H05K 13/00* (2006.01)
(Continued)

(52) U.S. Cl.
CPC ............ *H05K 5/069* (2013.01); *B60R 16/0239* (2013.01); *F16H 61/0006* (2013.01); *H05K 1/147* (2013.01); *H05K 5/0082* (2013.01);
(Continued)

(58) Field of Classification Search
CPC .. B60R 16/0239; H05K 1/147; H05K 5/0082; H05K 3/365; H05K 2201/10598
USPC ...................... 361/760–764, 792–795; 29/592
See application file for complete search history.

(56) References Cited

U.S. PATENT DOCUMENTS 5,639,990 A * 6/1997 Nishihara et al. ............. 174/527
6,133,627 A * 10/2000 Khandros et al. ............. 257/692
(Continued)

FOREIGN PATENT DOCUMENTS

DE    10100823 C1    2/2002
EP    0598914 A1    6/1994
(Continued)

*Primary Examiner* — Tuan T Dinh
*Assistant Examiner* — Mukund G Patel
(74) *Attorney, Agent, or Firm* — Laurence A. Greenberg; Werner H. Stemer; Ralph E. Locher

(57) ABSTRACT

A housing concept for integrated control electronics, comprising a housing bottom, a circuit carrier populated with electronic components of the central control electronics, and a signal and current distribution component as the electric connection between the central control electronics and peripheral components. The housing bottom is configured in the shape of a basin, the circuit carrier for the electronic components of the central control electronics being disposed therein such that the same can be electrically connected on at least one upwardly curved edge region to the signal and current distribution component disposed above the same via contact points, and wherein the housing bottom may also be connected circumferentially to the signal and current distribution component.

15 Claims, 4 Drawing Sheets

(51) Int. Cl.
*H05K 5/06* (2006.01)
*B60R 16/023* (2006.01)
*H05K 5/00* (2006.01)
*F16H 61/00* (2006.01)
*H05K 1/14* (2006.01)
*H05K 1/18* (2006.01)
*H05K 3/00* (2006.01)
*H05K 3/36* (2006.01)
*H05K 3/46* (2006.01)

(52) U.S. Cl.
CPC ............. *H05K1/141* (2013.01); *H05K 1/144* (2013.01); *H05K 1/189* (2013.01); *H05K 3/0061* (2013.01); *H05K 3/365* (2013.01); *H05K 3/4691* (2013.01); *H05K 2201/0999* (2013.01); *H05K 2201/10598* (2013.01); *H05K 2203/1147* (2013.01); *Y10T 29/49002* (2015.01)

(56) References Cited

U.S. PATENT DOCUMENTS

| | | | | |
|---|---|---|---|---|
| 6,296,494 | B1 * | 10/2001 | Yuasa et al. | 439/67 |
| 2006/0181859 | A1 * | 8/2006 | Thorum | 361/719 |

FOREIGN PATENT DOCUMENTS

| | | |
|---|---|---|
| EP | 1093326 A2 | 4/2001 |
| JP | 1197820 A | 8/1989 |
| JP | 4078190 A | 3/1992 |
| JP | 11097820 A | 4/1999 |
| WO | 9326142 A1 | 12/1993 |

\* cited by examiner

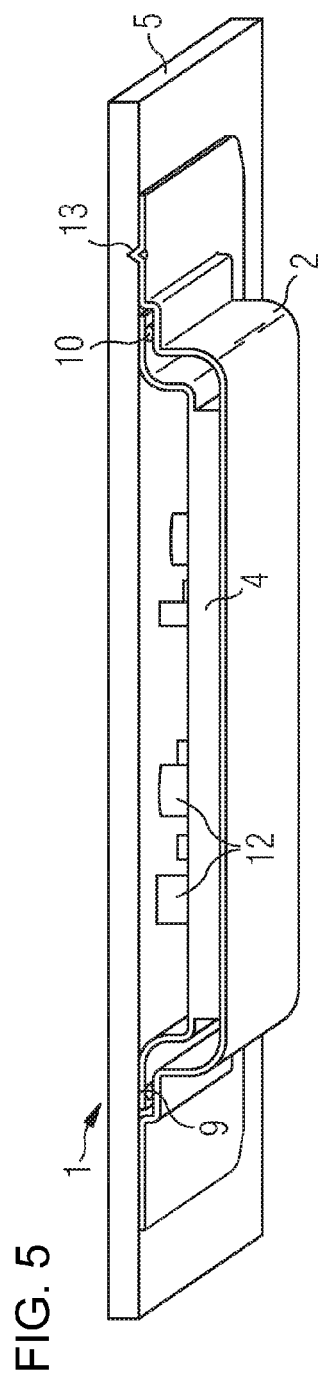
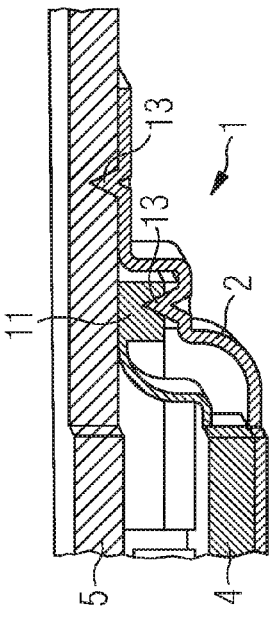
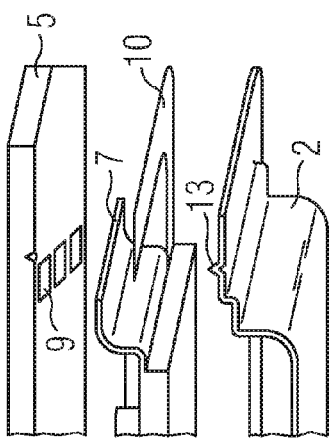
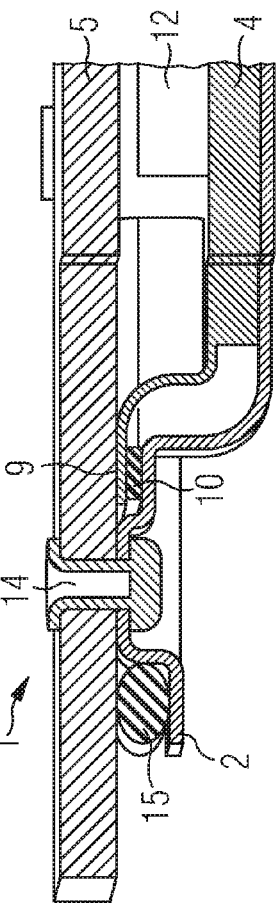
FIG. 5
FIG. 6
FIG. 7
FIG. 8

MODULE FOR INTEGRATED CONTROL ELECTRONICS HAVING SIMPLIFIED DESIGN

BACKGROUND OF THE INVENTION

1. Field of the Invention

The invention relates to a module for integrated control electronics, that is, to a housing concept for integrated control electronics, comprising a housing base, an interconnection substrate populated with electronic components of the central control electronics and a signal and current distribution component as the electrical connection between the central control electronics and peripheral components, and to a method for manufacturing such a module, particularly for transmission or engine control systems in the automotive industry.

2. Prior Art

In automotive engineering, components such as transmission, engine or braking systems are increasingly mainly electronically controlled. The trend here is toward integrated mechatronic control systems, i.e. to the integration of control electronics and the associated electronic components such as sensors or valves into the transmission, the engine or the braking system. Control devices therefore generally have a large number of electronic components which are connected to other components outside the control device. In the case of "peripheral electronics" of this kind, these control systems are no longer accommodated in a separate protected electronics compartment and therefore have to withstand corresponding environmental effects as well as mechanical, thermal and chemical stresses.

For this purpose, they are normally installed in special housings which also perform an important shielding function. In order to provide a reliable connection to components outside the housing, an electrical connection from the inside to the outside of the housing is necessary.

The usual structure for such integrated mechatronic applications consists of a ceramic substrate containing the different electronic components of the central control unit. Said ceramic substrate is bonded to rigid or flexible circuit boards in order to enable the peripheral components to be connected to the central unit. As already described, transmission control modules, for example, are accommodated in the transmission oil sump and therefore completely surrounded by oil and the conducting contaminations contained therein. This can be, for example, contaminations from gear tooth abrasion, machining residues from production processes or inadequate washing and cleaning of the transmission housing and/or the installed components. To provide the necessary protection against such contamination, damage and conductor track or bond shorts, a form of lidding, usually as a metallic, non-metallic or metalized housing cover, is placed onto the housing base plate and hermetically sealed. This composite structure comprising ceramic substrate, circuit boards and their links to the electronic connection of the peripherals as well as the hermetically sealed housing is a significant cost driver. In particular the LTCCs (low temperature cofired ceramics) preferably used as interconnection substrates which are mounted on a base plate to provide mechanical stability and thermal connection, constitute a major cost factor for the component as a whole. Their electronic connection via flexible circuit boards or leadframes to the components outside the sealed housing is also complex and therefore costly.

BRIEF SUMMARY OF THE INVENTION

The object of the invention is therefore to provide a module for integrated control electronics, consisting of a housing, a central control unit accommodated therein comprising different electronic components and an electronic connection between the inside and outside of the housing which provides a simple and flexible connection to components outside the housing, the electronic connection and the central control unit having a simplified and therefore less costly design while at the same time being reliably protected against short circuit and/or conducting contamination.

This object is achieved according to the invention with a device as claimed and with a method for manufacturing such a device, as claimed.

According to the invention, a housing concept is proposed for integrated control electronics, comprising a housing base, an interconnection substrate populated with electronic components of the central control electronics, and a signal and current distribution component as the electrical connection between the central control electronics and peripheral components, wherein the housing base is of trough-shaped design, the interconnection substrate for the electronic components of the central control electronics being disposed therein such that it can be electrically connected to the signal and current distribution component disposed thereabove by contact points on at least one upwardly bent edge area, and wherein the housing base is connected circumferentially to the signal and current distribution component.

In other words, a circuit board assembly is used according to the invention as the interconnection substrate, which additionally contains the electronic components of the central control unit and also ensures the dissipation of the heat generated by the power units via the trough-shaped housing base. The use of expensive ceramic substrates such as LTCCs (low temperature cofired ceramics), ceramic thick-film substrates or HTCCs (high temperature cofired ceramics) and their connection by means of rigid or flexible circuit boards to the peripheral components is therefore no longer necessary, but can nevertheless be performed in an inexpensive and simple manner using the inventive housing concept. The inventive concept advantageously enables the external contour of the electronic component to be adapted to suit the application-specific requirements by means of a stamping process. In respect of the signal and current distribution component, in addition to the implementation of crossovers and very fine conductor patterns, a surface-optimized structure with a very high number of connector contacts can be provided.

According to the invention, comparatively inexpensive PCBs (printed circuit boards) can be used as signal and current distribution components. It is equally possible to use multilayer flexible circuit boards as a signal and current distribution component. The signal and current distribution component is preferably two-layer or multilayer. Thus a two-layer PCB with an electrically isolating core and copper coating may preferably be used.

With particular preference, a double-sided PCB for signal and current distribution to e.g. connectors, sensors or actuators is used which consists of an electrically isolating core and a bilaterally applied conductive coating, preferably of copper. To avoid short circuits, open conductor track areas can be covered by a solder resist.

This design is relatively thin and advantageously allows three-dimensional structures to be implemented by bending individual PCB areas. This is very helpful in a transmission, for example, as different contact making levels are required among other things. At the same time, crossovers of the distribution paths are also possible in contrast to single-layer flexible circuit boards.

With further preference, the multilayer signal and current distribution component for its part has different contact points for the electronic connection of the peripheral components. As already described above, connections both for connectors and for sensors, valves and other actuators can be provided, thereby allowing a high degree of flexibility in the overall design of the electronic component.

In a preferred embodiment, the electronic connection of the components outside the housing can be implemented by means of press fit, soldering and/or laser welding techniques.

A variable, simple and reliable electronic connection to the peripheral components can be established via so-called press-fit pins. Equally preferably, this connection can also be made by laser welding depending on the requirement of the component. Generally the type of connection-making is not critical and can be selected from methods known to the person skilled in the art according to the respective requirements of the components and the process equipment available. Thus the connections can be established in a detachable manner e.g. as connectors or in a non-detachable manner by soldering or welding, for example. With particular preference, the circuit board is connected directly to the signal transmitters and receivers (particularly sensors, valves, etc.) outside the housing.

The interconnection substrate can be of single- or multipart design.

According to the invention, the interconnection substrate is preferably a multilayer PCB, with flexible regions implemented in the edge areas by partial depth milling which enable these areas to be bent upward. A three-dimensional structure can thus be formed there which allows adaptation to the trough-shaped design of the housing base.

The depth milling can be performed by means of laser ablation or milling. It can encompass the entire edge area of the interconnection substrate up to the edges. However, it can also equally be implemented as a groove, so that the PCB retains its original thickness at the connection areas of the edges. This provides the necessary flexibility for implementing the three-dimensional structures, while at the same time enabling the machining times due to the milling to be minimized.

In another preferred embodiment of the present invention, the electronic components of the central control electronics can be incorporated inside or on the surface of the multilayer PCB of the interconnection substrate. For example, printed resistors or capacitors, which can also be implemented as lines or areas, as well as chips or complex chips (ICs) can be used as electronic components. It is also possible for so-called bare chips, which are wire bonded, and packaged components, which are glued or soldered, to be processed. This ensures increased long-term stability and an excellent connection to the signal and potential distribution paths of the interconnection substrate.

The electronic components of the central control electronics can preferably be attached and/or bonded to the multilayer circuit board by means of soldering processes or gluing. Reflow soldering, for example, can be used as the soldering process.

Alternatively or additionally, the electronic components of the central control electronics can additionally be encapsulated with the multilayer substrate circuit board.

These industrial methods can be easily automated and therefore also incorporated into existing processes. Due to the trough-shaped design of the housing base and of the therein disposed interconnection substrate with upwardly bent edge and connection regions, the encapsulation of the electronic components with the PCB e.g. using silicone gel is greatly simplified compared to the hitherto known designs, as the gel can be simply poured into the trough while the housing is still open. The arrangement is easy to evacuate and bubble formation can also be easily prevented, thereby obviating the need for thixotropic silicone gels, in contrast to the prior art.

In another embodiment of the invention, a ceramic substrate can be used in conjunction with a one-piece or multi-piece PCB as an interconnection substrate.

In this case the multilayer PCB only has the task of ensuring the connection to the signal and current distribution component and the three-dimensional shape in the edge region for adaptation to the trough-shaped housing base. Very inexpensive PCBs can therefore be employed here which can be used in one piece as a frame for the ceramic substrate or in a multi-piece manner depending on requirements. Two-layer circuit boards with an electrically isolating core and a copper layer are preferably used in both variants.

The trough-shaped housing base preferably consists of a press-bent part of a metallic material, with particular preference aluminum. In a preferred embodiment of the invention, the interconnection substrate is inserted in the metal base trough and glued in a permanent and temperature-optimized manner using a thermally conductive adhesive. This ensures not only good heat dissipation but also reliable and inexpensive fixing.

This also downwardly seals off the electronics compartment from the transmission oil, for example.

With particular preference, studs or other fastening elements which ensure a defined seating of the interconnection substrate can be formed at the edge regions of the trough-shaped housing base.

To produce a housing concept according to the invention for an electronic control unit, an interconnection substrate is populated with the electronic components of the central control electronics, inserted in a trough-shaped housing base, optionally encapsulated using a potting compound, and a signal and current distribution component disposed thereabove is connected electrically to the interconnection substrate and mechanically to the trough-shaped housing base in a single step.

The interconnection substrate can be optionally attached by means of thermally conductive adhesive to the inside of the trough-shaped housing base. The upwardly bent edge regions of the interconnection substrate with the connection points for the electrical connection to the signal and current distribution component are glued to the upper sides of the housing trough by means of thermally conductive adhesive after they are optionally pre-attached to the trough in a defined manner by means of fastening elements such as formed studs. Until the adhesive has cured, this advantageously enables the height to be adjusted slightly so that during assembly the signal and current distribution component lies flat against the corresponding edge regions of the interconnection substrate.

If a greater tolerance compensation is to be achieved, a damping element can be provided between the trough-shaped housing and the interconnection substrate. For additional mechanical stabilization of the contact points between interconnection substrate and signal and current distribution component, lamination e.g. using double-sided acrylic adhesive tape can be additionally provided around the contact points.

After insertion of the interconnection substrate in the trough-shaped housing base, the arrangement can be optionally sealed by pouring in a potting compound such as silicone gel.

With particular preference, the mechanical connection between housing base, interconnection substrate and signal and current distribution component disposed thereabove is established in a combined step with the electrical interconnection of the components. For this purpose, the electrical connections are implemented by means of soldering and, at the same time, the mechanical connection by means of laminating.

In this way it is advantageously possible to implement a mechanically robust housing concept which enables the encapsulation step to be carried out while still in the open state. Because of the reduction in the parts count compared to existing prior art designs and the combining of two process steps into one, simplified assembly is also advantageously ensured. In addition, due to the reliability of the lamination process, the otherwise usual tightness test can be dispensed with.

The housing concept according to the invention is preferably used for an integrated motor vehicle transmission control system.

BRIEF DESCRIPTION OF THE SEVERAL VIEWS OF THE DRAWING

The invention will now be explained in exemplary fashion with reference to a plurality of variants in conjunction with, but without being limited to, the accompanying drawings in which:

FIG. 5 shows a perspective sectional view of a housing concept according to the invention, FIG. 6 shows an exploded detail view of the edge region of a housing concept according to the invention, FIG. 7 and FIG. 8 show detail sectional views of alternative variants of an interconnection substrate of the housing concept according to the invention.

DESCRIPTION OF THE INVENTION

Figure 1:
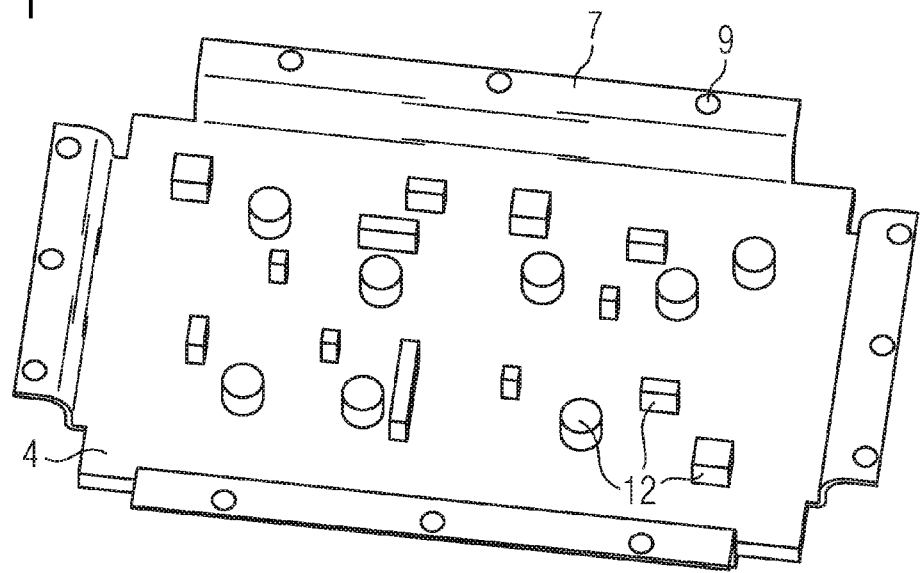
FIG. 1 shows a perspective plan view of an interconnection substrate according to the invention for a housing concept for integrated control electronics.

FIG. 1 shows a perspective plan view of an interconnection substrate 4 of the inventive housing concept 1 for integrated control electronics, populated with electronic components 12. The edge regions of the multilayer PCB 4 used as interconnection substrate are inventively bent upward 7 and have, on the upper side, contact points 9 in the form of solder contacts. The bending of the PCB is achieved by depth milling of the corresponding areas. This removal of material can be achieved by milling or laser ablation.

Figure 2:
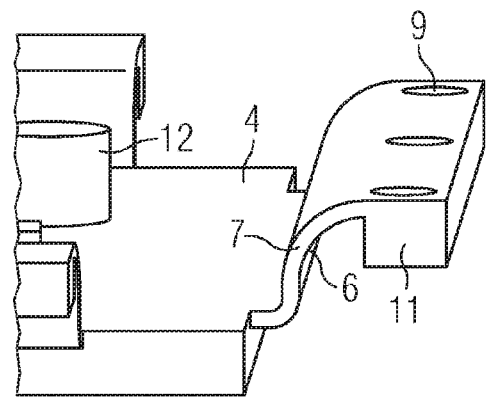
FIG. 2 shows a detail view of an edge region of an interconnection substrate according to the invention as per FIG. 1.
Figure 3:
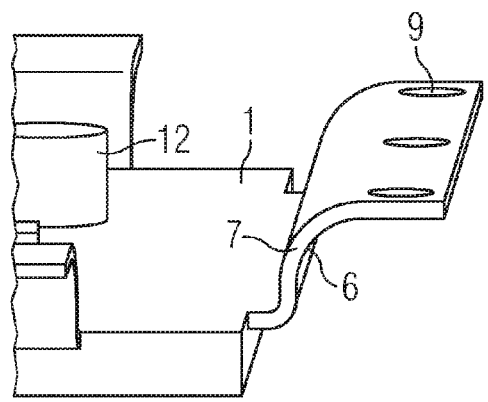
FIG. 3 shows a detail view of an alternatively implemented edge region of an interconnection substrate according to the invention as per FIG. 1.

FIG. 2 and FIG. 3 show detail views of the edge regions 7 of an interconnection substrate 4 for a housing concept 1 according to the invention. The depth milling 6 in FIG. 2 is implemented as a groove so that the original thickness of the interconnection substrate 11 is retained in the edge region below the contact points 9 for the electrical contacting. As an alternative, FIG. 3 shows depth milling 6 which provides uniform removal of material as far as the edge also below the contact points 9 for the electrical connection of the signal and current distribution component (not shown).

Figure 4:
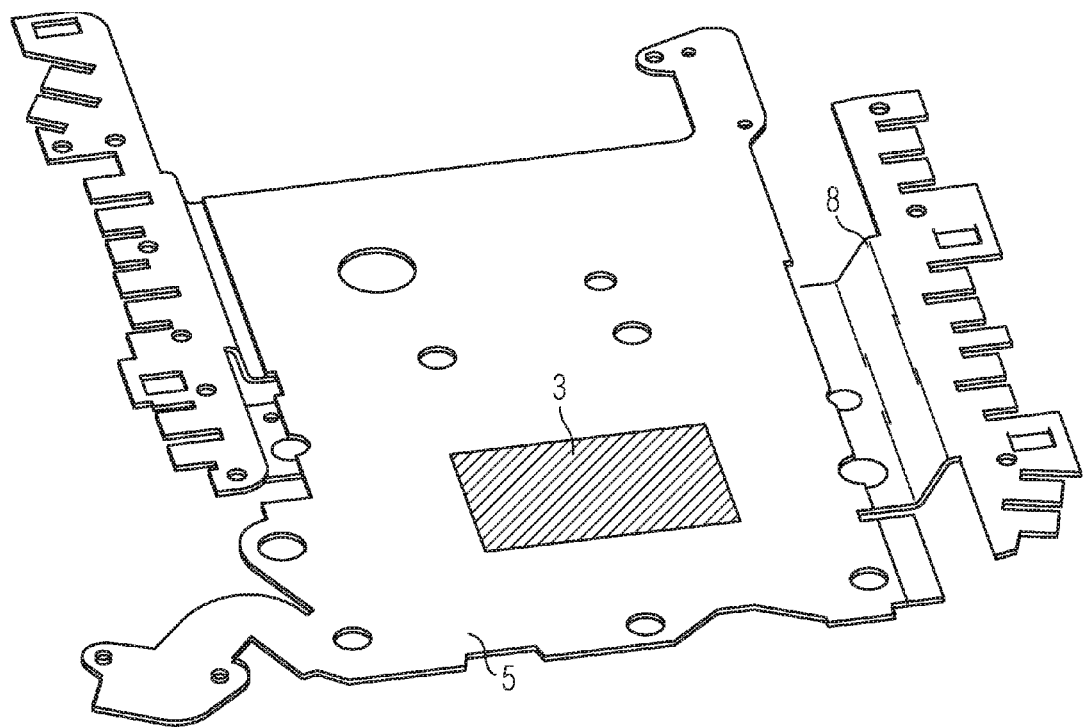
FIG. 4 shows a perspective plan view of a signal and current distribution component of the housing concept according to the invention.

FIG. 4 shows a signal and current distribution component 5 for an inventive housing concept 1 in a perspective plan view. The signal and current distribution component 5 is made up of a multilayer PCB having an electrically isolated core and two open copper coatings applied thereto. Alternatively, a PCB with a core and a single coating can equally be used. The placement area 3 for the interconnection substrate 4 shown in FIGS. 1 to 3 is represented here as a hatched area. In addition, three-dimensional structures 8 can also be implemented for the signal and current distribution component 5 e.g. by bending with or without depth milling. This and the possibility of stamping the component provides flexible adaptation to the application-specific requirements in terms of dimensioning and architecture.

FIG. 5 shows a perspective sectional view of an inventive housing concept 1. The interconnection substrate 4 populated with the electronic components 12 of the central control electronics is bent upward in its edge regions 7 so that it lies flat against the signal and current distribution component 5 disposed thereabove. The trough-shaped housing base 2 is preferably an aluminum press-bent part and completely accommodates the interconnection substrate 4. The trough-shaped housing base is attached to the thereabove disposed signal and current distribution component 5 at its edge regions. The attachment is preferably performed by means of lamination 10. In addition, other mechanical fastenings such as lugs 13, studs, screws or rivets 14 can be provided. The trough-shaped housing base 2 simultaneously acts as a heat sink for the interconnection substrate 4 disposed therein which is therefore preferably attached to the housing base by means of thermally conductive adhesive.

FIG. 6 shows an exploded detail view of the edge regions of an inventive housing concept 1 from FIG. 5. The signal and current distribution component 5 has solder contacts areas 9 for connection of the interconnection substrate 4. The interconnection substrate 4 populated with electronic components 12 is bent upward in its edge region 7 which is made possible by depth milling 6 of the corresponding areas. This enables it to be attached in these areas by lamination 10 to the housing base 2, e.g. by means of sealing adhesive in the form of an epoxy or acrylic adhesive foil. The trough-shaped housing base 2 is preferably produced as an aluminum press-bent part and accommodates the interconnection substrate 4 populated with the electronic components 12. It has at its edges a flat area for lamination to the signal and current distribution component 5 using sealing adhesive in the form of an epoxy or acrylic adhesive foil. A liquid adhesive in the form of a bead can equally be applied. At the same time, there is also provided a projection for engaging corresponding lugs 13 of the housing base 2 in a corresponding recess of the signal and current distribution component so as to provide further mechanical stabilization.

FIG. 7 and FIG. 8 show detail sectional views of alternative variants of the inventive housing concept 1. In FIG. 7, in the trough-shaped housing base 2 with inserted interconnection substrate 4 and thereto attached signal and current distribution component 5, the housing concept includes the implementation of additional lugs 13 which can engage, on the one hand, in the corresponding recesses in the edge region 11 in the original thickness of the interconnection substrate 4 and, on the other, in the signal and current distribution component 5. Alternatively, as shown in FIG. 8, the housing base 2 can also be attached to the signal and current distribution component 5 in a sealed manner using a seal 15. In addition to the lamination 10 of the substrate 4, another mechanical fastening in the form of a rivet 14 can be simultaneously provided. This alternative design provides improved sealing also for environments incompatible with simple lamination, such as special transmission oils, for example.

Figure 9:
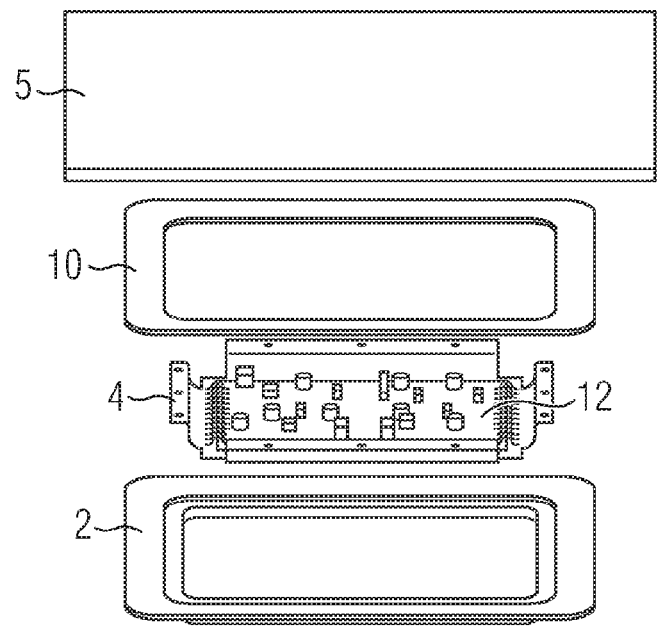
FIG. 9 shows an exploded perspective plan view of another embodiment of the invention and FIG. 10 and FIG. 11 show illustrations of two embodiments of the inventive housing concept using ceramic substrates as interconnection substrates.

FIG. 9 shows an exploded perspective plan view of another embodiment of the invention. Into the trough-shaped housing base 2 an interconnection substrate 4 is inserted which, in contrast to the examples in the previous drawings, has a ceramic substrate 12 as an electronic component interconnection substrate 4. The ceramic substrate 12 is disposed within a recess of the interconnection substrate 4 and is connected thereto by thin wire bonds. The interconnection substrate 4 has upwardly bent edge regions 7 which inventively hold the contact points 9 for connection to the signal and current distribution component 5. Alternatively, the interconnection substrate 4 can also be of multi-part design and individual legs can be connected to the ceramic substrate via bonds. Depending on the design of the ceramic substrate, it is in this way possible, for example, to use only one or two sub-parts of the interconnection substrate 4, which can result in a significant saving of material. In this respect it is further preferred to use a two-layer interconnection substrate with a core and a copper coating. The signal and current distribution component 5 is fixed to the trough-shaped housing base 2 by lamination 10.

Figure 10:
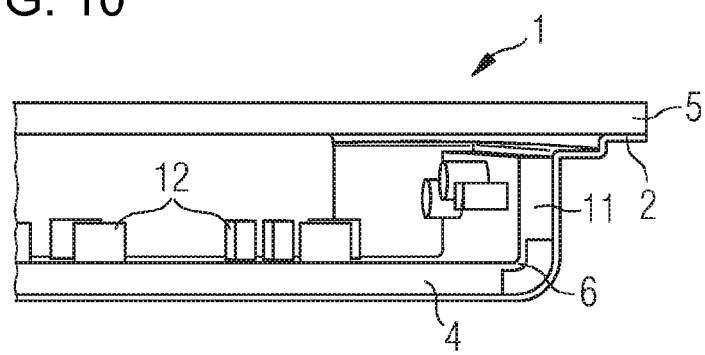
Figure 11:
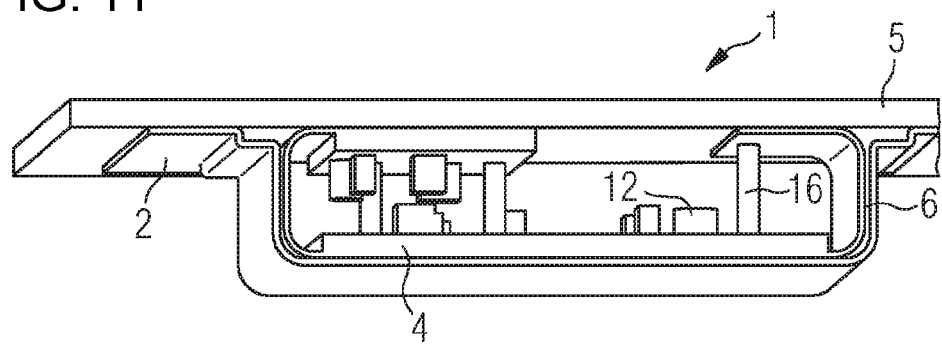

FIG. 10 and FIG. 11 illustrate two embodiments of the inventive housing concept 1 with differently implemented edge regions 7 of the interconnection substrate 4. In FIG. 10, the upwardly bent edge region 7 has an edge area in the original thickness 11 of the interconnection substrate 4. It is therefore possible to dispose electronic components 12 also in this area, thereby enabling an advantageous architecture to be achieved in respect of heat distribution and path rationalization. In FIG. 11, on the other hand, the upwardly bent edge regions 7 of the interconnection substrate 4 are made larger and extend via another bend to the horizontal opposite the interconnection substrate. Also in the latter, the edge regions can in some cases have the original thickness of the interconnection substrate and support electronic components 12. These electronic components are therefore disposed opposite the other electronic components of the interconnection substrate. Non-active electronic components such as capacitors, for example, are preferably disposed in the edge regions. For additional stabilization, spacers and supporting elements 16 can additionally be provided. This further alternative once again provides a more flexible architecture of the housing concept 1.

To summarize, a housing concept for integrated control electronics is proposed wherein the housing base is trough shaped, the interconnection substrate for the electronic components of the central control electronics is disposed therein such that it can be electrically connected to the signal and current distribution component disposed thereabove by means of contact points on at least one upwardly bent edge region, and wherein the housing base is circumferentially connected to the signal and current distribution component.

This design advantageously obviates the need for separate lidding of the housing. Signal and potential distribution as well as the mounting function for the electronic components can be assumed by relatively inexpensive PCBs so that the use of comparatively expensive flexible printed circuit boards can be dispensed with. At the same time the housing concept according to the invention enables an improvement in the EMC shielding values and dissipation of waste heat to be achieved.

The assembly process can be significantly shortened by the lamination and soldering of the interconnection substrate to the thereabove disposed signal and current distribution component in a single step.

The assembly can also be easily and inexpensively incorporated into the overall electronic device assembly process.

The invention claimed is:

1. A housing module for integrated control electronics, comprising:
    a housing base formed in a trough shape and having an upwardly bent edge region;
    a circuit carrier substrate populated with electronic components of the control electronics, said substrate being disposed in said housing base, said substrate formed with contact points;
    a signal and current distribution component disposed above said housing base for electrically connecting the control electronics with peripheral components;
    said circuit carrier substrate for said electronic components being electrically connected by way of said contact points to said signal and current distribution component; and
    a mechanical fastening device attaching said housing base to said signal and current distribution component, said mechanical fastening device located outside a circumference defined by said contact points.

2. The housing module according to claim 1, wherein said signal and current distribution component is a multilayer component.

3. The housing module according to claim 2, wherein said signal and current distribution component is a two-layer component.

4. The housing module according to claim 2, wherein said multilayer signal and current distribution component is formed with a plurality of contact points for electronically connecting the peripheral components.

5. The housing module according to claim 2, wherein said circuit carrier substrate is a single-piece substrate.

6. The housing module according to claim 2, wherein said circuit carrier substrate is a multi-piece substrate.

7. The housing module according to claim 1, wherein said electronic components of the control electronics are attached and/or contacted by way of soldering, gluing or bonding to said circuit carrier substrate.

8. The housing module according to claim 1, wherein said electronic components of the central control electronics are incorporated in said circuit carrier substrate and/or encapsulated by said circuit carrier substrate.

9. The housing module according to claim 1 configured for an integrated transmission control system of a motor vehicle.

10. The housing module according to claim 1, wherein said mechanical fastening device is selected from the group consisting of a lug, a stud, a screw, and a rivet.

11. The housing module according to claim 1, further comprising a ceramic substrate disposed in the trough-shaped housing base in addition to said substrate.

12. A method of manufacturing a housing module according to claim 1, which comprises:
    populating a circuit carrier substrate with electronic components of a central control electronics, the circuit carrier substrate having contact points;
    mounting the circuit carrier substrate in a trough-shaped housing base;
    placing a signal and current distribution component thereabove and connecting the signal and current distribution component electrically to the contact points of the circuit carrier substrate; and attaching the housing base to the signal and current distribution component with a mechanical fastening device located outside a circumference defined by the contact points.

13. The method according to claim 12, which comprises encapsulating the circuit carrier substrate in the trough-shaped housing base with a potting compound.

14. The method according to claim 12, wherein the mechanical fastening device is selected from the group consisting of a lug, a stud, a screw, and a rivet.

15. The method according to claim 12, which further comprises disposing a ceramic substrate in the trough-shaped housing base in addition to the substrate.

* * * * *